(12) United States Patent
Jiang et al.

(10) Patent No.: US 10,444,580 B2
(45) Date of Patent: Oct. 15, 2019

(54) ARRAY SUBSTRATE, DISPLAY PANEL, DISPLAY APPARATUS, AND FABRICATING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Liangliang Jiang, Beijing (CN); Haiyang Wang, Beijing (CN); Lei Guo, Beijing (CN); Yongjun Yoon, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/762,189

(22) PCT Filed: Mar. 30, 2017

(86) PCT No.: PCT/CN2017/078803
§ 371 (c)(1),
(2) Date: Mar. 22, 2018

(87) PCT Pub. No.: WO2018/176327
PCT Pub. Date: Oct. 4, 2018

(65) Prior Publication Data
US 2019/0072828 A1    Mar. 7, 2019

(51) Int. Cl.
*G02F 1/1362*    (2006.01)
*G02F 1/1335*    (2006.01)
(Continued)

(52) U.S. Cl.
CPC ...... *G02F 1/136209* (2013.01); *G02F 1/1368* (2013.01); *G02F 1/133512* (2013.01);
(Continued)

(58) Field of Classification Search
CPC ......... G02F 1/136209; G02F 1/133528; H01L 27/3272; H01L 29/78633
See application file for complete search history.

(56) References Cited

U.S. PATENT DOCUMENTS

2002/0024622 A1    2/2002    Murade
2014/0118656 A1    5/2014    Jang et al.
(Continued)

FOREIGN PATENT DOCUMENTS

CN    1506738 A    6/2004
CN    104678643 A    6/2015
(Continued)

OTHER PUBLICATIONS

International Search Report & Written Opinion dated Jan. 3, 2018, regarding PCT/CN2017/078803.

*Primary Examiner* — Selim U Ahmed
*Assistant Examiner* — Evan G Clinton
(74) *Attorney, Agent, or Firm* — Intellectual Valley Law, P.C.

(57) ABSTRACT

The present application discloses a thin film transistor including a base substrate; an active layer; and a first linear polarization block configured to shield at least a portion of the active layer from light. A projection of the first linear polarization block on the base substrate at least partially overlaps with that of the active layer.

13 Claims, 6 Drawing Sheets

(51) Int. Cl.
*G02F 1/1368* (2006.01)
*H01L 27/32* (2006.01)
*H01L 29/786* (2006.01)

(52) U.S. Cl.
CPC .... *G02F 1/133528* (2013.01); *H01L 27/3272* (2013.01); *H01L 29/78633* (2013.01); *G02F 2001/13685* (2013.01); *G02F 2001/133567* (2013.01); *G02F 2202/36* (2013.01)

(56) References Cited

U.S. PATENT DOCUMENTS

| | | |
|---|---|---|
| 2016/0013259 A1 | 1/2016 | Yang et al. |
| 2017/0017027 A1* | 1/2017 | Tsuruoka .......... G02F 1/133528 |
| 2017/0038639 A1 | 2/2017 | Fang et al. |
| 2017/0179439 A1* | 6/2017 | Tian ................. G02F 1/136209 |
| 2019/0011772 A1* | 1/2019 | Yao ...................... G02F 1/1333 |

FOREIGN PATENT DOCUMENTS

| | | | |
|---|---|---|---|
| CN | 104698525 A | 6/2015 | |
| CN | 104765143 A | 7/2015 | |
| CN | 105304671 A | 2/2016 | |

* cited by examiner

US 10,444,580 B2

ARRAY SUBSTRATE, DISPLAY PANEL, DISPLAY APPARATUS, AND FABRICATING METHOD THEREOF

CROSS-REFERENCE TO RELATED APPLICATION

This application is a national stage application under 35 U.S.C. § 371 of International Application No. PCT/CN2017/078803, filed Mar. 30, 2017, the contents of which are incorporated by reference in the entirety.

TECHNICAL FIELD

The present invention relates to display technology, more particularly, to an array substrate, a display panel and a display apparatus having the same, and a fabricating method thereof.

BACKGROUND

Display apparatuses such as liquid crystal display apparatuses and organic light-emitting diode display apparatuses have been widely used. Liquid crystal display apparatuses and organic light-emitting diode display apparatuses use thin film transistor (TFT) to control pixels in the display panel. Examples of TFT include amorphous silicon TFT, polycrystalline silicone TFT, single crystal silicon TFT, and metal oxide TFT.

SUMMARY

In one aspect, the present invention provides a thin film transistor comprising a base substrate; an active layer; and a first linear polarization block configured to shield at least a portion of the active layer from light; wherein a projection of the first linear polarization block on the base substrate at least partially overlaps with that of the active layer.

Optionally, the first linear polarization block is made of a nano-linear polarization material.

Optionally, the first linear polarization block substantially covers a channel region of the active layer.

Optionally, the thin film transistor further comprises a gate electrode on a side of the active layer distal to the first linear polarization block; wherein the projection of the first linear polarization block on the base substrate substantially overlaps with that of the gate electrode.

Optionally, the thin film transistor further comprises a buffer layer between the first linear polarization block and the active layer.

Optionally, the active layer is on a side of the first linear polarization block distal to the base substrate; and the first linear polarization block is configured to shield at least a portion of the active layer from light of a back light.

Optionally, the thin film transistor further comprises a second linear polarization block corresponding to the first linear polarization block; wherein a projection of the second linear polarization block on the base substrate at least partially overlaps with that of the active layer; the first linear polarization block has a first transmission axis; and the second linear polarization block has a second transmission axis substantially perpendicular to the first transmission axis.

Optionally, the active layer is on a side of one of the first linear polarization block and the second linear polarization block proximal to the base substrate; and the first linear polarization block and the second linear polarization block are configured to shield at least a portion of the active layer from light emitted from a light emitting layer.

Optionally, the nano-linear polarization material comprises a compound selected from the group consisting of magnesium fluoride ($MgF_2$), zinc oxide (ZnO), titanium oxide ($TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$), iridium oxide ($IrO_x$), aluminum oxide ($Al_2O_3$), silicon oxide ($SiO_2$), silicon on glass, and silicon nitride ($Si_3N_4$).

Optionally, the first linear polarization block is made of a non-metal material.

In another aspect, the present invention provides an array substrate comprising a base substrate; a plurality of thin film transistors on the base substrate, each of which comprising an active layer; and a first linear polarization layer comprising a plurality of first linear polarization blocks, each of which configured to shield at least a portion of the active layer from light; wherein a projection of one of the plurality of first linear polarization blocks on the base substrate at least partially overlaps with that of the active layer.

Optionally, the first linear polarization layer is made of a nano-linear polarization material.

Optionally, the plurality of first linear polarization blocks is limited in an inter-subpixel region of the array substrate.

Optionally, the one of the plurality of first linear polarization blocks substantially covers a channel region of the active layer.

Optionally, each of the plurality of thin film transistors further comprises a gate electrode on a side of the active layer distal to the one of the plurality of first linear polarization blocks; and the projection of the one of the plurality of first linear polarization blocks on the base substrate substantially overlaps with that of the gate electrode.

Optionally, the array substrate further comprises a buffer layer between the first linear polarization layer and the active layer.

Optionally, the nano-linear polarization material comprises a compound selected from the group consisting of magnesium fluoride ($MgF_2$), zinc oxide (ZnO), titanium oxide $TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$), iridium oxide ($IrO_x$), aluminum oxide ($Al_2O_3$), silicon oxide ($SiO_2$), silicon on glass, and silicon nitride ($Si_3N_4$).

Optionally, the first linear polarization block is made of is a non-metal material.

Optionally, the active layer is on a side of one of the plurality of first linear polarization blocks distal to the base substrate; and each of the plurality of first linear polarization blocks is configured to shield at least a portion of the active layer from light of a back light.

Optionally, the array substrate further comprises a second linear polarization layer comprising a plurality of second linear polarization blocks respectively corresponding to the plurality of first linear polarization blocks; wherein a projection of the one of the plurality of second linear polarization blocks on the base substrate at least partially overlaps with that of the active layer, each of the plurality of first linear polarization blocks has a first transmission axis; and each of the plurality of second linear polarization blocks has a second transmission axis substantially perpendicular to the first transmission axis.

Optionally, the active layer is on a side of one of the plurality of first linear polarization blocks and one of the plurality of second linear polarization blocks proximal to the base substrate; and the one of the plurality of first linear polarization blocks and the one of the plurality of second linear polarization blocks are configured to shield at least a portion of the active layer from light emitted from a light emitting layer.

In another aspect, the present invention provides a display panel comprising an array substrate described herein.

In another aspect, the present invention provides a display apparatus comprising the display panel described herein.

In another aspect, the present invention provides a liquid crystal display apparatus, comprising an array substrate; a counter substrate facing the array substrate; and a lower polarizer on the array substrate; wherein the array substrate comprises a base substrate; a linear polarization layer on the base substrate, comprising a plurality of linear polarization blocks; and a plurality of thin film transistors, each of which comprising an active layer on a side of one of the plurality of linear polarization blocks distal to the base substrate; and wherein a projection of the one of the plurality of linear polarization blocks on the base substrate at least partially overlaps with that of the active layer; and each of the plurality of linear polarization blocks has a first transmission axis; and the lower polarizer on the array substrate has a third transmission axis substantially perpendicular to the first transmission axis.

Optionally, the liquid crystal display apparatus further comprises an upper polarizer on the counter substrate; wherein the upper polarizer has a fourth transmission axis substantially parallel to the first transmission axis.

Optionally, the plurality of linear polarization blocks is limited in an inter-subpixel region of the array substrate.

Optionally, the one of the plurality of linear polarization blocks substantially covers a channel region of the active layer.

Optionally, each of the plurality of thin film transistors further comprises a gate electrode on a side of the active layer distal to the one of the plurality of linear polarization blocks.

Optionally, the projection of the one of the plurality of linear polarization blocks on the base substrate substantially overlaps with that of the gate electrode.

Optionally, the liquid crystal display apparatus further comprises a buffer layer between the linear polarization layer and the active layer.

Optionally, the linear polarization layer is made of a nano-linear polarization material.

Optionally, the nano-linear polarization material comprises a compound selected from the group consisting of magnesium fluoride ($MgF_2$), zinc oxide (ZnO), titanium oxide ($TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$); iridium oxide ($IrO_x$), aluminum oxide ($Al_2O_3$), silicon oxide ($SiO_2$), silicon on glass, and silicon nitride ($Si_3N_4$).

Optionally, the linear polarization block is made of a non-metal material.

In another aspect, the present invention provides a method of fabricating an array substrate, comprising forming a plurality of thin film transistors on a base substrate, each of which is formed to comprise an active layer; and forming a first linear polarization layer comprising a plurality of first linear polarization blocks, each of which configured to shield at least a portion of the active layer from light; wherein a projection of one of the plurality of first linear polarization blocks on the base substrate at least partially overlaps with that of the active layer.

Optionally, each of the plurality of thin film transistors is formed to comprise a gate electrode; and the gate electrode and the first linear polarization layer are patterned using a same mask plate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
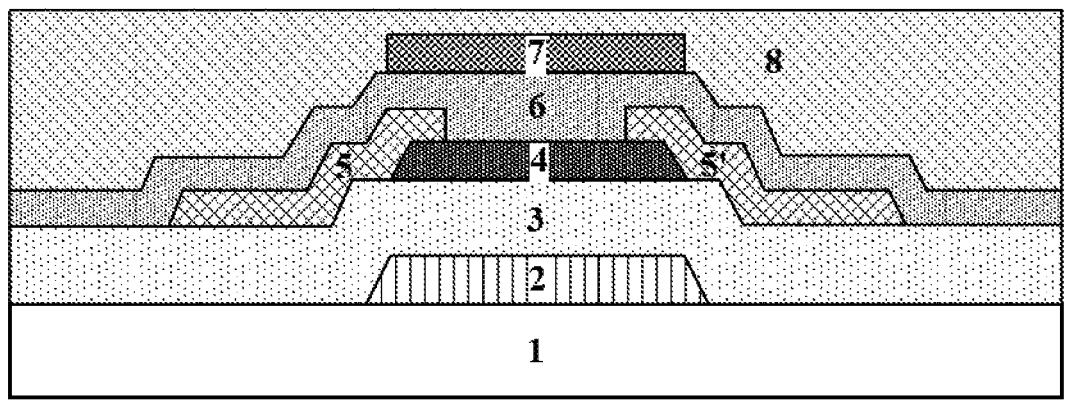
FIG. 1 is a schematic diagram illustrating the structure of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Typically, the thin film transistors in conventional display apparatuses have a relatively large leak current, $I_{off}$, leading to a relatively small $I_{on}/I_{off}$, and adversely affecting display quality. Moreover, when the active layers of the thin film transistors are irradiated by light, a relatively large leak current can be produced. Thin film transistors at different positions of a display panel may be irradiated differently, e.g., by light of different intensities. As a result, the threshold voltages of these thin film transistors also vary, in part, depending on different leak currents in the thin film transistors. This may lead to various display defects such as flicker and cross-talk.

For example, in a liquid crystal display apparatus, the thin film transistors in the array substrate may be irradiated by light emitted from a back light. Particularly, for a liquid crystal display apparatus having top gate-type thin film transistors, the active layers of the thin film transistors are exposed to light from the back light. Even for a liquid crystal display apparatus having bottom gate-type thin film transistors, in which the gate electrode is disposed on a side of the active layer proximal to the back light, the gate electrode is often found to be insufficient to shield the active layer from light.

For a light emitting diode display apparatus, a back light is typically not required. However, the thin film transistors in a light emitting diode display apparatus are still affected by light emitted from a light emitting layer of the light emitting diode display apparatus. For example, for a bottom emission type light emitting diode display apparatus or a dual emission type light emitting diode display apparatus, the thin film transistors in the array substrate are exposed to light emitted from the light emitting layer. Particularly, for those light emitting diode display apparatuses having bottom gate-type thin film transistors, the active layers of the thin film transistors are directly exposed to light from the light emitting layer. Even for a light emitting diode display apparatus having top gate-type thin film transistors, in which the gate electrode is disposed on a side of the active layer proximal to the light emitting layer, the gate electrode is often found to be insufficient to shield the active layer from light.

In conventional display apparatuses, a metal light shielding layer is used for shield the active layer from light either from a back light or from a light emitting layer. However, it is discovered in the present disclosure that the metal light shielding layer inevitably produces parasitic capacitance with other metal components of the display apparatus, e.g., a data line, a pixel electrode, and a common electrode. The presence of the parasitic capacitance adversely affects charging rates of the pixel and the display quality.

Accordingly, the present disclosure provides, inter alia, an array substrate, a display panel and a display apparatus having the same, and a fabricating method thereof that substantially obviate one or more of the problems due to limitations and disadvantages of the related art. In one aspect, the present disclosure provides an array substrate having a base substrate; a plurality of thin film transistors on the base substrate, each of which including an active layer; and a first linear polarization layer including a plurality of first linear polarization blocks, each of which configured to shield at least a portion of the active layer from light. Optionally, a projection of one of the plurality of first linear polarization blocks on the base substrate in plan view of the array substrate at least partially overlaps with that of the active layer. Optionally, plurality of first linear polarization blocks is limited in an inter-subpixel region of the array substrate. The linear polarization layer in the present disclosure can effectively shield the active layer of the thin film transistor. However, the linear polarization layer may be made (but limited to) using a non-metal linear polarization material, thereby obviating any parasitic capacitance caused by the conventional metal light shielding layer. The charging rate of the pixels and the display quality are significantly enhanced by including the present linear polarization layer in the display apparatus having the present array substrate.

As use herein, the term "linear polarization layer" refers to an optical layer that allows the transmission of radiation of which the electric vector is restricted to one plane resulting in linearly polarized radiation.

As used herein, an inter-subpixel region refers to a region between adjacent subpixel regions, such as a region corresponding to a black matrix in a liquid crystal display, or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 1 is a schematic diagram illustrating the structure of an array substrate in some embodiments according to the present disclosure. Referring to FIG. 1, the array substrate in some embodiments includes a base substrate 1; a plurality of thin film transistor on the base substrate 1, each of the plurality of thin film transistor includes an active layer 4 and a first linear polarization layer having a plurality of first linear polarization blocks 2, each of the plurality of first linear polarization blocks 2 configured to shield at least a portion of the active layer 4 from light, e.g., an external light from a back light, or light emitted from a light emitting layer of the array substrate. Optionally, the plurality of first linear polarization blocks 2 is limited in an inter-subpixel region of the array substrate. Optionally, the one of the plurality of first linear polarization blocks 2 substantially covers a channel region of the active layer 4 in plan view of the array substrate. For example, a projection of the channel region of the active layer 4 on the base substrate 1 substantially overlaps with, and is within, that of the one of the plurality of first linear polarization blocks 2. Optionally, the one of the plurality of first linear polarization blocks 2 substantially covers the active layer 4 in plan view of the array substrate. For, example, a projection of the active layer 4 on the base substrate 1 substantially overlaps with, and is within, that of the one of the plurality of first linear polarization blocks 2. Optionally, the projection of the active layer 4 on the base substrate 1 substantially overlaps with, and is substantially co-extensive with, that of the one of the plurality of first linear polarization blocks 2.

Referring to FIG. 1, in some embodiments, each of the plurality of thin film transistors further includes a gate electrode 7 on a side of the active layer 4 distal to the one of the plurality of first linear polarization blocks 2. Optionally, the thin film transistor is a top gate-type thin film transistor. Optionally, the projection of the one of the plurality of first linear polarization blocks 2 on the base substrate 1 in plan view of the array substrate substantially overlaps with that of the gate electrode 7. Optionally, the projection of the one of the plurality of first linear polarization blocks 2 on the base substrate 1 in plan view of the array substrate substantially overlaps with, and is substantially co-extensive with, that of the gate electrode 7.

Referring to FIG. 1, the array substrate in some embodiment further includes a buffer layer 3 between the first linear polarization layer and the active layer 4. Optionally, the array substrate further includes a source electrode 5 and a drain electrode 5' on a side of the buffer layer 3 and the active layer 4 distal to the base substrate 1, a gate insulating layer 6 on a side of the source electrode 5, the drain electrode 5', and the active layer 4 distal to the base substrate 1, a gate electrode 7 on a side of the gate insulating layer 6 distal to the base substrate 1, and a passivation layer on a side of the gate electrode 7 distal to the base substrate 1.

Figure 2:
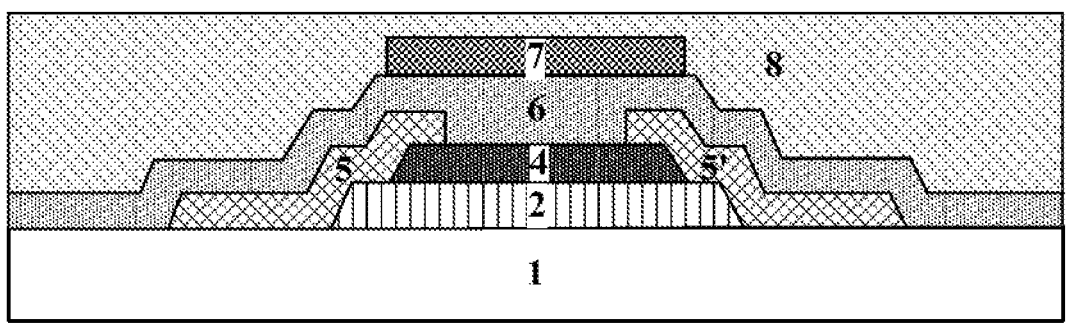
FIG. 2 is a schematic diagram illustrating the structure of an array substrate in some embodiments according to the present disclosure.

FIG. 2 is a schematic diagram illustrating the structure of an array substrate in some embodiments according to the present disclosure. Referring to FIG. 2, the array substrate in some embodiments includes a base substrate 1; a plurality of thin film transistor on the base substrate 1, each of the plurality of thin film transistor includes an active layer 4; and a first linear polarization layer having a plurality of first linear polarization blocks 2, each of the plurality of first linear polarization blocks 2 configured to shield at least a portion of the active layer 4 from light. The array substrate in FIG. 2 differs from the array substrate in FIG. 1 in that the array substrate in FIG. 2 does not include a buffer layer between the first linear polarization layer and the active layer 4. The first linear polarization layer in the array substrate in FIG. 2 is directly disposed on the base substrate 1, and the active layer 4 is disposed on a side of one of the plurality of first linear polarization blocks 2 distal to the base substrate 1.

Figure 3:
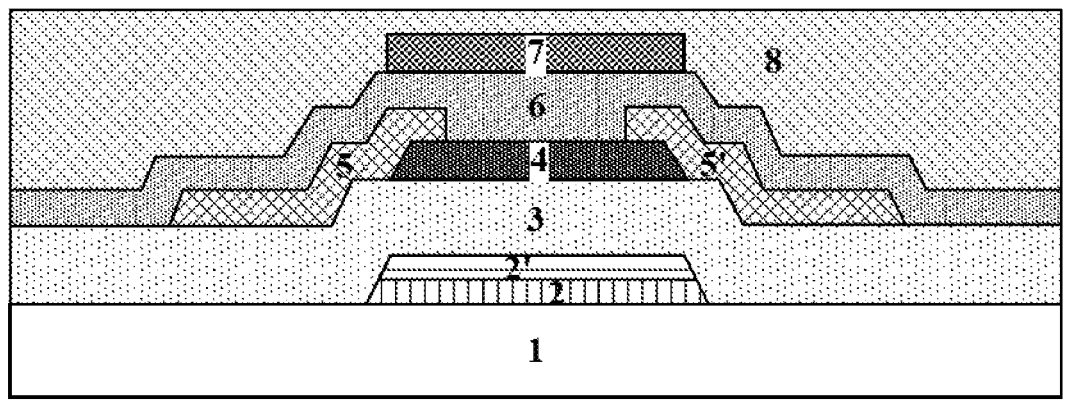
FIG. 3 is a schematic diagram illustrating the structure of an array substrate in some embodiments according to the present disclosure.

FIG. 3 is a schematic diagram illustrating the structure of an array substrate in some embodiments according to the present disclosure. Referring to FIG. 3, the array substrate in some embodiments further includes a second linear polarization layer having a plurality of second linear polarization blocks 2' respectively corresponding to the plurality of first linear polarization blocks 2. Optionally, a projection of the one of the plurality of second linear polarization blocks 2' on the base substrate 1 in plan view of the array substrate at least partially overlaps with that of the active layer 4. Optionally, projections of both the one of the plurality of first linear polarization blocks 2 and the one of the plurality of second linear polarization blocks 2' on the base substrate 1 in plan view of the array substrate at least partially overlap with that of the active layer 4. Optionally, the first linear polarization layer and the second linear polarization layer abut each other, e.g., the first linear polarization layer and the second linear polarization layer are laminated together. Optionally, the first linear polarization layer and the second linear polarization layer are spaced apart by one or more layers of the array substrate. Optionally, each of the plurality of first linear polarization blocks has a first transmission axis, and each of the plurality of second linear polarization blocks has a second transmission axis substantially perpendicular to the first transmission axis. Optionally, the second linear polarization layer is on a side of the first linear polarization layer distal to the base substrate 1. Optionally, a projection of the one of the plurality of second linear polarization blocks 2' on the base substrate 1 in plan view of the array substrate substantially overlaps with that of a corresponding one of the plurality of first linear polarization blocks 2.

In some embodiments, the array substrate is an array substrate in a liquid crystal display apparatus. Typically, a liquid crystal display apparatus includes an upper polarizer on the counter substrate, and a lower polarizer on the array substrate. In order for the first linear polarization layer to shield the active layer 4 from light, e.g., light emitted from a back light disposed proximal to the lower polarizer, the first transmission axis of the each of the plurality of first linear polarization blocks 2 has to be substantially perpendicular to a third transmission axis of the lower polarizer. Optionally, the array substrate in the liquid crystal display apparatus may have a second linear polarization layer including a plurality of second linear polarization blocks 2' as discussed above, and the second transmission axis of the plurality of second linear polarization blocks 2' is substantially perpendicular to the first transmission axis. Optionally, the second transmission axis is substantially parallel to the third transmission axis of the lower polarizer. In a liquid crystal display apparatus having the lower polarizer, the first linear polarization layer alone is sufficient to substantially shield the active layer 4 from light. By having the second linear polarization layer, any light leaking through the first linear polarization layer can be further blocked by the second linear polarization layer.

Optionally, the liquid crystal display apparatus further includes an upper polarizer disposed on the counter substrate. Optionally, the upper polarizer has a fourth transmission axis. Optionally, the first transmission axis is substantially perpendicular to the fourth transmission axis. Optionally, the second transmission axis is substantially parallel to the fourth transmission axis.

In some embodiments, the array substrate is an array substrate in a light emitting diode display apparatus, e.g., an organic light emitting diode display apparatus. The light emitting diode display apparatus is self-emitting apparatus that does not require a back light. The light emitting diode display apparatus differs from the liquid crystal display apparatus in that it does not include a liquid crystal molecule layer, and thus does not include a lower polarizer and an upper polarizer. Typically, the light emitting diode display apparatus includes a light emitting layer that emits light to a light emitting surface. In a bottom emission type light emitting diode display apparatus or a dual emission type light emitting diode display apparatus, the light emitted from the light emitting layer irradiates on the thin film transistors disposed on the array substrate, thus may greet the performance of these thin film transistors over time. Because the light emitting diode apparatus does not include an upper polarizer or a lower polarizer, and the light irradiated on the thin film transistors (and the active layers thereof) is not from an external source such as a back light, the first linear polarization layer alone is insufficient to block all light from the light emitting layer. Thus, in a light emitting diode display apparatus, it is required to have both the first linear polarization layer and the second linear polarization layer in order to substantially shield the active layer 4 from light emitted from the light emitting layer, the first linear polarization layer having the first transmission axis substantially perpendicular to the second transmission axis of the second linear polarization axis.

Figure 4:
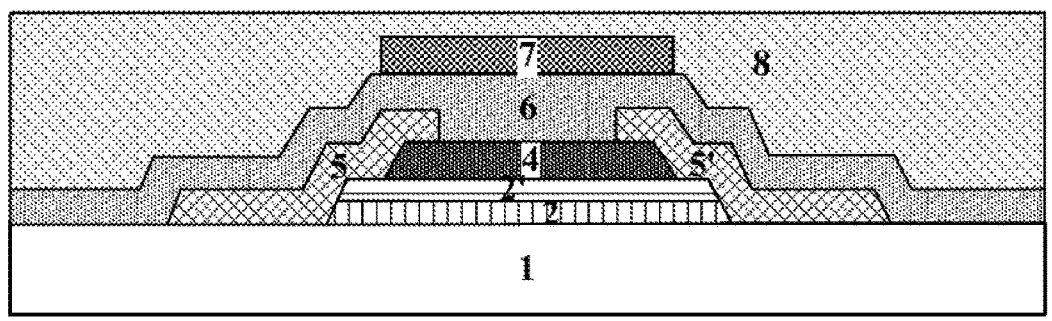
FIG. 4 is a schematic diagram illustrating the structure of an array substrate in some embodiments according to the present disclosure.

FIG. 4 is a schematic diagram illustrating the structure of an array substrate in some embodiments according to the present disclosure. Referring to FIG. 4, the array substrate in some embodiments includes a base substrate 1; a plurality of thin film transistors on the base substrate 1, each of the plurality of thin film transistor includes an active layer 4; a first linear polarization layer having a plurality of first linear polarization blocks 2; and a second linear polarization layer having a plurality of second linear polarization blocks 2'; each of the plurality of first linear polarization blocks 2 configured to shield at least a portion of the active layer 4 from light when paired with one of the plurality of second linear polarization blocks 2'. The array substrate in FIG. 4 differs from the array substrate in FIG. 3 in that the array substrate in FIG. 4 does not include a buffer layer between the second linear polarization layer and the active layer 4. The first linear polarization layer and the second linear polarization layer in the array substrate in FIG. 4 are directly disposed on the base substrate 1, and the active layer 4 is disposed on a side of one of the plurality of first linear polarization blocks 2 and one of the plurality of second linear polarization blocks 2' distal to the base substrate 1.

Figure 5:
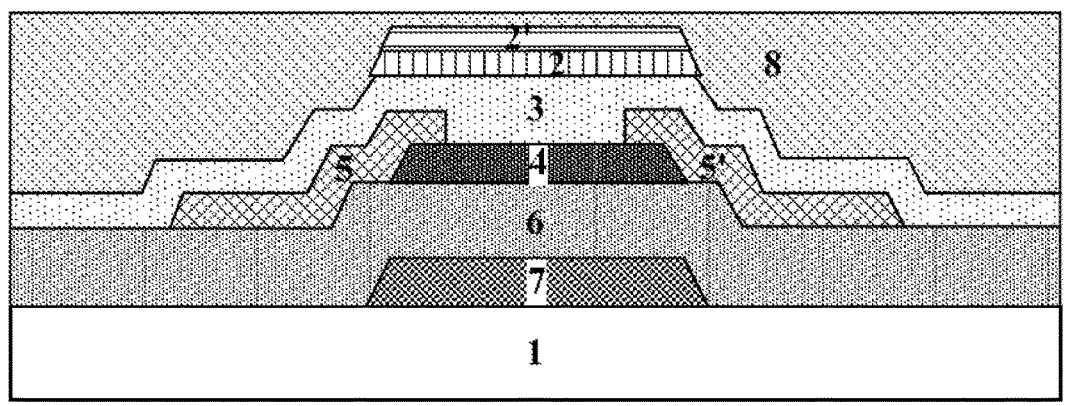
FIG. 5 is a schematic diagram illustrating the structure of an array substrate in some embodiments according to the present disclosure.

The thin film transistors in the arrays substrate of FIGS. 1 to 4 are top gate-type thin film transistors. In some embodiments, the thin film transistors are bottom gate-type thin film transistors. Particularly, when the array substrate is an array substrate in a light emitting diode display apparatus and the thin film transistors are bottom gate-type thin film transistors, the first linear polarization layer and the second linear polarization layer may be used to shield the active layer 4 from light emitted from the light emitting layer of the light emitting diode apparatus. FIG. 5 is a schematic diagram illustrating the structure of an array substrate in some embodiments according to the present disclosure. Referring to FIG. 5, the array substrate in some embodiments includes a plurality of bottom gate-type thin film transistors. The array substrate in some embodiments includes a base substrate 1, a plurality of thin film transistor on the base substrate 1, each of the plurality of thin film transistor includes a gate electrode 7 on the base substrate 1, a gate insulating layer 6 on a side of the gate electrode 7 distal to the base substrate 1, and an active layer 4 on a side of the gate insulating layer 6 distal to the base substrate 1. The array substrate further includes a buffer layer 3 on a side of the active layer 4 distal to the base substrate 1, a first linear polarization layer having a plurality of first linear polarization blocks 2 on a side of the buffer layer 3 distal to the active layer 4, and a second linear polarization layer having a plurality of second linear polarization blocks 2' on a side of the first linear polarization layer distal to the base substrate 1. In some embodiments, the array substrate further includes a light emitting layer on a side of the second linear polarization layer distal to the base substrate. Optionally, the light emitting diode apparatus is a bottom emission type light emitting diode apparatus or a dual emission type light emitting diode apparatus. Light emitted from the light emitting layer, or light reflected by a reflective top electrode towards the base substrate 1, is shielded by the first linear polarization layer and the second linear polarization layer from the active layer 4. Each of the plurality of first linear polarization blocks 2 has a first transmission axis, and each of the plurality of second linear polarization blocks 2' has a second transmission axis substantially perpendicular to the first transmission axis, thereby substantially blocking light irradiated from the light emitting layer or the reflective top electrode.

For array substrates having both the first linear polarization layer and the second linear polarization layer, the first linear polarization layer and the second linear polarization layer may be disposed abutting each other, e.g., as a laminated two-layer structure. Optionally, the array substrate may include one or more layers between the first linear polarization layer and the second linear polarization layer. The one or more layer between the first linear polarization layer and the second linear polarization layer, however, is not a linear polarization layer having a transmission axis not substantially perpendicular to one of the first transmission axis and the second transmission axis. In one example, the array substrate may include more than two linear polarization layers, the first linear polarization layer and the second linear polarization layer are adjacent linear polarization layers among all linear polarization layers, and the first transmission axis being substantially perpendicular to the second transmission axis.

Figure 6:
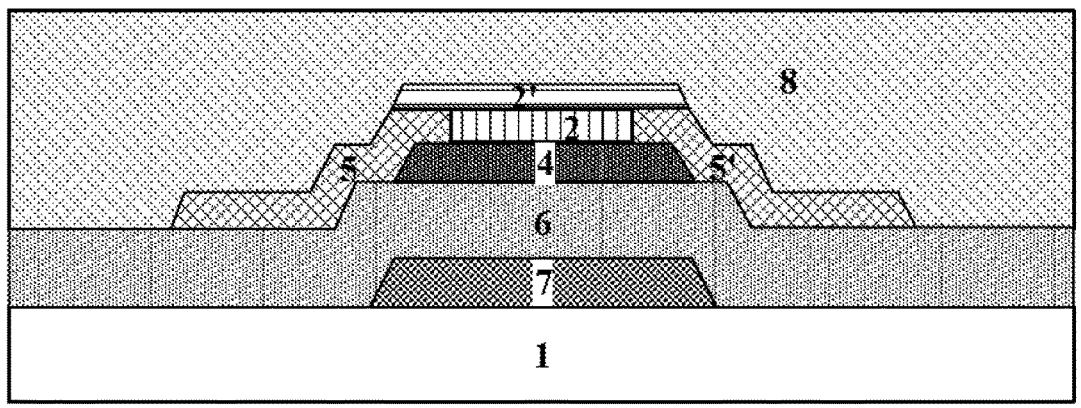
FIG. 6 is a schematic diagram illustrating the structure of an array substrate in some embodiments according to the present disclosure.

FIG. 6 is a schematic diagram illustrating the structure of an array substrate in some embodiments according to the present disclosure. Referring to FIG. 6, the array substrate in some embodiments includes a plurality of bottom gate-type thin film transistors. The array substrate in some embodiments includes a base substrate 1, a plurality of thin film transistor on the base substrate 1, each of the plurality of thin film transistor includes a gate electrode 7 on the base substrate 1, a gate insulating layer 6 on a side of the gate electrode 7 distal to the base substrate 1, and an active layer 4 on a side of the gate insulating layer 6 distal to the base substrate 1. The array substrate further includes a first linear polarization layer having a plurality of first linear polarization blocks 2 on a side of the active layer 4 distal to the base substrate 1, a second linear polarization layer having a plurality of second linear polarization blocks 2' on a side of the first linear polarization layer distal to the base substrate 1, and a passivation layer 8 on a side of the second linear polarization layer distal to the base substrate 1. In some embodiments, the array substrate further includes a light emitting layer on a side of the second linear polarization layer distal to the base substrate. The array substrate in FIG. 6 differs from the array substrate in FIG. 5 in that the array substrate in FIG. 6 does not include a buffer layer between the first linear polarization layer and the active layer 4. The first linear polarization layer and the second linear polarization layer in the array substrate in FIG. 4 are directly disposed on the active layer 4. Optionally, the first linear polarization layer and the second linear polarization layer are made of an insulating, non-metal material.

Various appropriate semiconductor materials and various appropriate fabricating methods may be used to make the linear polarization layer, e.g., the first linear polarization layer and the second linear polarization layer. For example, a linear polarization material may be deposited on the substrate, e.g., by sputtering or vapor deposition or solution coating; and patterned. In some embodiments, the linear polarization material is a non-metal linear polarization material. Examples of linear polarization materials include, but are not limited to, magnesium fluoride ($MgF_2$), zinc oxide (ZnO), titanium oxide ($TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$), iridium oxide ($IrO_x$), aluminum oxide ($Al_2O_3$), silicon oxide ($SiO_2$), silicon on glass, and silicon nitride ($Si_3N_4$). Optionally, the linear polarization layer is made of a nano-linear polarization material. Examples of nano-linear polarization materials include, but are not limited to, nano-magnesium fluoride ($MgF_2$), nano-zinc oxide (ZnO), nano-titanium oxide ($TiO_2$), nano-indium tin oxide (ITO), nano-indium zinc oxide (IZO), nano-aluminum zinc oxide (AZO), nano-magnesium zinc oxide (MZO), nano-gallium zinc oxide (GZO), nano-ruthenium oxide ($RuO_x$), nano-iridium oxide ($IrO_x$), nano-aluminum oxide ($Al_2O_3$), nano-silicon oxide ($SiO_2$), nano-silicon on glass, and nano-silicon nitride ($Si_3N_4$). Optionally, the linear polarization layer is made of a nano-zinc oxide material. Optionally, the linear polarization layer is made of a nano-titanium oxide material. Optionally, the linear polarization layer is made of a nano-magnesium fluoride material.

In some embodiments, the linear polarization layer is made of a plurality of nano particles such as nan-rods, nano-fibers, and nano-platelets. In some embodiments, the linear polarization layer is formed by forming a nano-particles layer having a plurality of nano-particles on the base substrate, and aligning the plurality of nano-particles along a substantially the same direction. Optionally, transmission axes of the plurality of nano-particles are aligned along a substantially the same direction. For example, when the plurality of nano-particles are a plurality of nano-rods, longitudinal axes of the plurality of nano-rods are aligned along a substantially same direction, thereby aligning the transmission axes of the plurality of nano-rods along a substantially the same direction. Optionally, the transmission axes are substantially parallel to the longitudinal axes. Optionally, the transmission axes are along a direction different from that of the longitudinal axes. Optionally, the step of aligning the plurality of nano-particles is performed by an electrically induced alignment process. Optionally, the step of aligning the plurality of nano-particles is performed by an electrospinning process. Optionally, the step of aligning the plurality of nano-particles is performed by a photoalignment process.

Figure 7A:
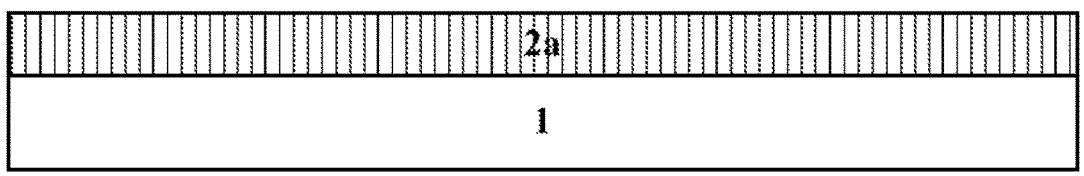
FIGS. 7A to 7H illustrate a process of fabricating an array substrate in some embodiments according to the present disclosure.

In another aspect, the present disclosure provides a method of fabricating an array substrate. In some embodiments, the method includes forming a plurality of thin film transistors on a base substrate, each of which including an active layer; and forming a first linear polarization layer including a plurality of first linear polarization blocks, each of which configured to shield at least a portion of the active layer from light. The first linear polarization layer is formed so that a projection of one of the plurality of first linear polarization blocks on the base substrate in plan view of the array substrate at least partially overlaps with that of the active layer. FIGS. 7A to 7H illustrate a process of fabricating an array substrate in some embodiments according to the present disclosure. Referring to FIG. 7A, the method in some embodiments includes forming a linear polarization material layer 2a on a base substrate 1. For example, a linear polarization material may be sputtered (e.g., by magnetron sputtering) onto the base substrate 1. In one example, the linear polarization material includes magnesium fluoride.

Figure 7B:
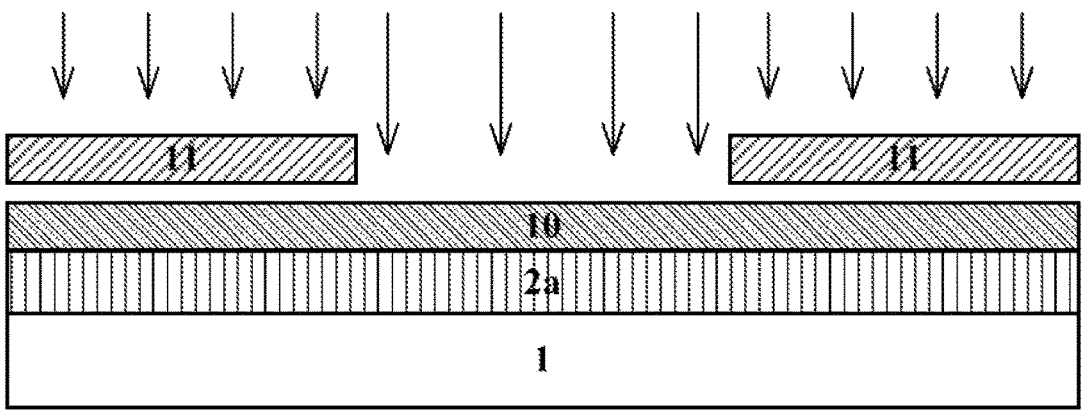
Figure 7C:
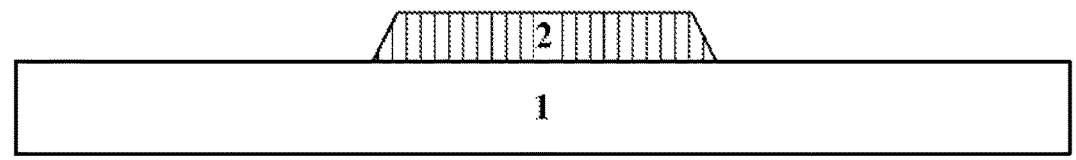

Referring to FIG. 7B, the method in some embodiments further includes forming a photoresist material layer 10 on a side of the linear polarization material layer 2a distal to the base substrate 1. Optionally, the photoresist material layer 10 is a negative photoresist material layer. The method further includes exposing the photoresist material layer 10 using a mask plate 11, and developing the exposed photoresist material layer to obtain a photoresist pattern having a first region corresponding to a first linear polarization layer and a second region outside the first region. The photoresist material is removed in the second region thereby exposing the linear polarization material layer 2a in the second region. The exposed linear polarization material layer 2a in the second region is then removed by, e.g., etching thereby forming the first linear polarization layer having a plurality of first linear polarization blocks 2 (FIG. 7C).

Figure 7D:
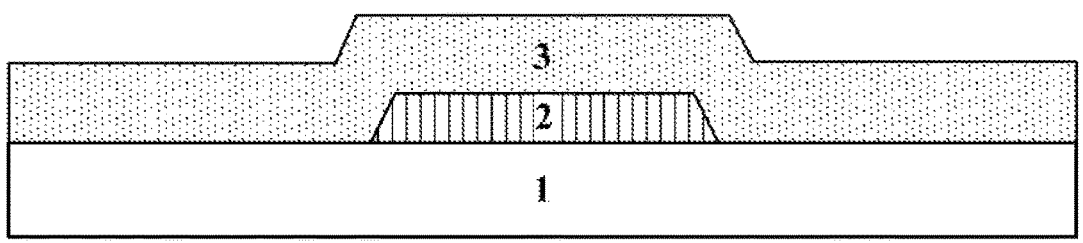

Referring to FIG. 7D, the method in some embodiments further includes forming a buffer layer 3 on a side of the first linear polarization layer distal to the base substrate 1. Various appropriate insulating materials and various appropriate fabricating methods may be used to make the buffer layer 3. For example, an insulating material may be deposited on the substrate by a plasma-enhanced chemical vapor deposition (PECVD)) process. Examples of appropriate insulating materials include, but are not limited to, silicon oxide ($SiO_y$), silicon nitride ($SiN_y$, e.g., $Si_3N_4$), and silicon oxynitride ($SiO_xN_y$).

Figure 7E:
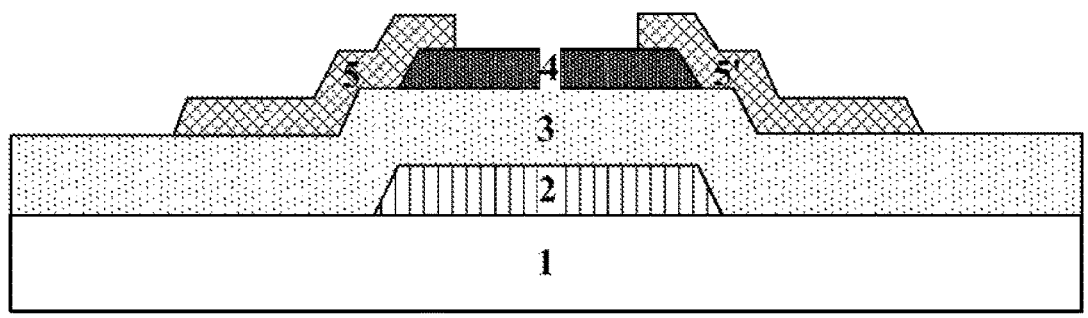

Referring to FIG. 7E, the method in some embodiments further includes forming an active layer 4, a source electrode 5, and a drain electrode 5' on a side of the buffer layer 3 distal to the base substrate 1. Various appropriate semiconductor materials and various appropriate fabricating methods may be used to make the active layer 4. For example, a semiconductor material may be deposited on the substrate by a plasma-enhanced chemical vapor deposition (PECVD) process. Examples of appropriate semiconductor materials for making the active layer includes, but are not limited to, metal oxides (e.g., IGZO, ITO, IZTO, IGTO), amorphous silicon, low temperature polycrystalline silicon, etc. Various appropriate electrode materials and various appropriate fabricating methods may be used to make the source electrode 5 and the drain electrode 5'. For example, an electrode material may be deposited on the substrate, e.g., by sputtering or vapor deposition or solution coating; and patterned. Examples of appropriate electrode materials for making the source electrode and the drain electrode include, but are not limited to, aluminum, molybdenum, aluminum Neodymium (AlNd), copper, molybdenum Niobium (MoNb) and alloys thereof. Optionally, the active layer 4, the source electrode 5, and the drain electrode 5' may be patterned using a single mask plate, e.g., a half-tone mask plate or a gray-tone mask plate. Optionally, the active layer 4 is formed using a first mask plate, and the source electrode 5 and the drain electrode 5' are formed using a second mask plate different from the first mask plate.

Figure 7F:
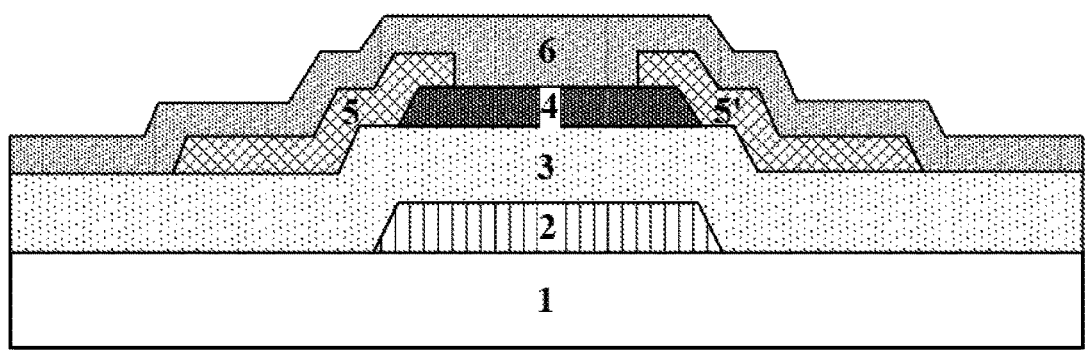

Referring to FIG. 7F, the method in some embodiments further includes forming a gate insulating layer 6 on a side of the active layer 4, the source electrode 5, and the drain electrode 5' distal to the buffer layer 3. Various appropriate insulating materials and various appropriate fabricating methods may be used to make the gate insulating layer 6. For example, an insulating material may be deposited on the substrate by a plasma-enhanced chemical vapor deposition (PECVD) process. Examples of appropriate insulating materials for making the insulating layer include, but are not limited to, silicon oxide ($SiO_y$), silicon nitride ($SiN_y$, e.g., $Si_3N_4$), silicon oxynitride ($SiO_xN_y$), and polyimide.

Figure 7G:
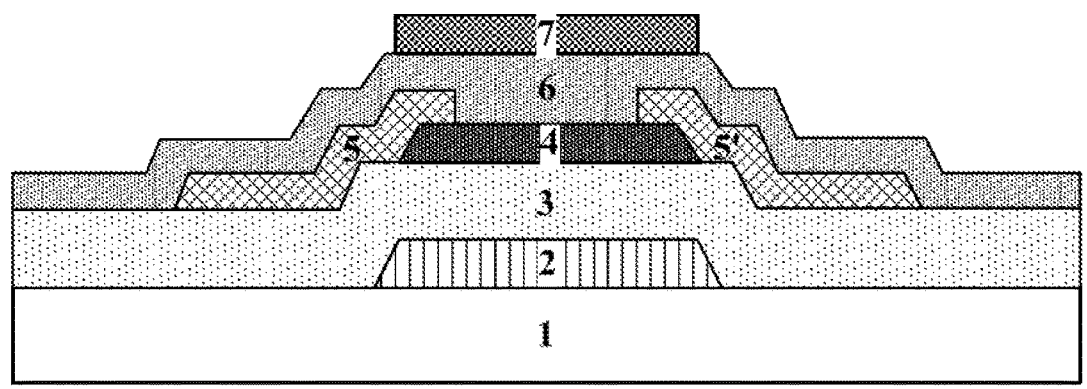

Referring to FIG. 7G, the method in some embodiments further includes forming a gate electrode 7 on a side of the gate insulating layer 6 distal to the base substrate 1. Various appropriate electrode materials and various appropriate fabricating methods may be used to make the gate electrode 7. For example, an electrode material may be deposited on the substrate, e.g., by sputtering or vapor deposition or solution coating and patterned. Examples of appropriate electrode materials for making the gate electrode include, but are not limited to, aluminum, molybdenum, aluminum Neodymium (AlNd), copper, molybdenum Niobium (MoNb), alloys and laminates thereof (e.g., a molybdenum-aluminum-molybdenum laminated structure).

In some embodiments, a same mask plate may be used for forming the gate electrode 7 and the first linear polarization layer. Optionally, a projection of the one of the plurality of first linear polarization blocks 2 on the base substrate 1 in plan view of the array substrate substantially overlaps with that of the gate electrode 7. Optionally, the projection of the gate electrode 7 on the base substrate 1 substantially overlaps with, and is substantially co-extensive with, that of the one of the plurality of first linear polarization blocks 2.

Figure 7H:
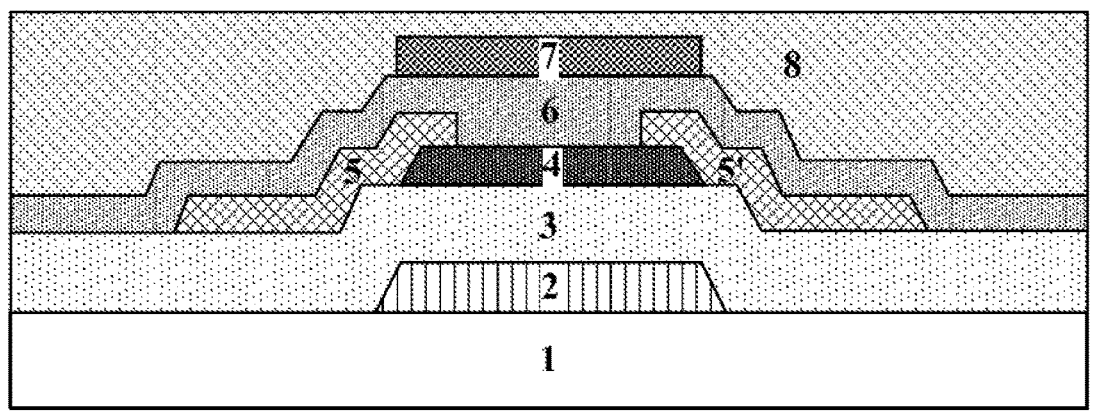

Referring to FIG. 7H, the method in some embodiments further includes forming a passivation layer 8 on a side of the gate electrode 7 distal to the base substrate 1. Various appropriate insulating materials and various appropriate fabricating methods may be used to make the passivation layer 8. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN_y$).

Optionally, the plurality of first linear polarization blocks 2 is formed to be limited in an inter-subpixel region of the array substrate. Optionally, the one of the plurality of first linear polarization blocks 2 is formed to substantially cover a channel region of the active layer 4 in plan view of the array substrate. For example, the first linear polarization layer is formed so that a projection of the channel region of the active layer 4 on the base substrate 1 substantially overlaps with, and is within, that of the one of the plurality of first linear polarization blocks 2. Optionally, the first linear polarization layer is formed so that the one of the plurality of first linear polarization blocks 2 substantially covers the active layer 4 in plan view of the array substrate. For example, the first linear polarization layer is formed so that a projection of the active layer 4 on the base substrate 1 substantially overlaps with, and is within, that of the one of the plurality of first linear polarization blocks 2. Optionally, the first linear polarization layer is formed so that the projection of the active layer 4 on the base substrate 1 substantially overlaps with, and is substantially co-extensive with, that of the one of the plurality of first linear polarization blocks 2.

Optionally, the gate electrode 7 is formed on a side of the active layer 4 distal to the one of the plurality of first linear polarization blocks 2 (see, e.g., FIGS. 1 to 6). Optionally, the buffer layer 3 is formed between the first linear polarization layer and the active layer 4, e.g., between the plurality of first linear polarization blocks 2 and the active layer 4.

In some embodiments, the method further includes forming a second linear polarization layer having a plurality of second linear polarization blocks respectively corresponding to the plurality of first linear polarization blocks. The second linear polarization layer is formed so that a projection of the one of the plurality of second linear polarization blocks on the base substrate in plan view of the array substrate at least partially overlaps with that of the active layer. Optionally, the plurality of second linear polarization blocks is formed to be limited in an inter-subpixel region of the array substrate. Optionally, each of the plurality of second linear polarization blocks is formed to substantially cover a channel region of an active layer in plan view of the array substrate. For example, the second linear polarization layer is formed so that a projection of the channel region of the active layer on the base substrate substantially overlaps with, and is within, that of one of the plurality of second linear polarization blocks. Optionally, the second linear polarization layer is formed so that the one of the plurality of second linear polarization blocks 2' substantially covers the active layer in plan view of the array substrate. For example, the second linear polarization layer is formed so that a projection of the active layer on the base substrate substantially overlaps with, and is within, that of the one of the plurality of second linear polarization blocks. Optionally, the second linear polarization layer is formed so that the projection of the active layer on the base substrate substantially overlaps with, and is substantially co-extensive with, that of the one of the plurality of second linear polarization blocks. Optionally, the second linear polarization layer is formed so that a projection of the one of the plurality of second linear polarization blocks 2' on the base substrate 1 in plan view of the array substrate substantially overlaps with that of a corresponding one of the plurality of first linear polarization blocks 2.

Optionally, each of the plurality of first linear polarization blocks has a first transmission axis; and each of the plurality of second linear polarization blocks has a second transmission axis substantially perpendicular to the first transmission axis.

Optionally, the first linear polarization layer and the second linear polarization layer may be formed abutting each other, e.g., as a laminated two-layer structure. Optionally, the array substrate may be formed to include one or more layers between the first linear polarization layer and the second linear polarization layer. The one or more layer between the first linear polarization layer and the second linear polarization layer, however, is not a linear polarization layer having a transmission axis not substantially perpendicular to one of the first transmission axis and the second transmission axis. In one example, the array substrate is formed to include more than two linear polarization layers, the first linear polarization layer and the second linear polarization layer are adjacent linear polarization layers among all linear polarization layers, and the first transmission axis being substantially perpendicular to the second transmission axis.

Optionally, the active layer is formed on a side of one of the plurality of first linear polarization blocks and one of the plurality of second linear polarization blocks proximal to the base substrate; the one of the plurality of linear polarization blocks and the one of the plurality of second linear polarization blocks are configured to shield at least a portion of the active layer from light emitted from a light emitting layer.

In another aspect, the present disclosure provides a display panel having an array substrate described herein or fabricated by a method described herein. Optionally, the display panel is a liquid crystal display panel. Optionally, the display panel is a light emitting diode display panel.

In another aspect, the present disclosure provides a display apparatus having a display panel described herein. Optionally, the display apparatus is a liquid crystal display apparatus. Optionally, the display apparatus is a light emitting diode display apparatus. Examples of apparatuses include, but are not limited to, an electronic paper, a mobile phone, a tablet computer, a television, a notebook computer, a monitor, a digital album, a GPS, etc.

In some embodiments, the liquid crystal display apparatus includes an array substrate; a counter substrate facing the array substrate; and a lower polarizer on the array substrate. Optionally, the array substrate includes a base substrate; a linear polarization layer on the base substrate, including a plurality of linear polarization blocks; and a plurality of thin film transistors, each of which including an active layer on a side of one of the plurality of linear polarization blocks distal to the base substrate. Optionally, a projection of the one of the plurality of linear polarization blocks on the base substrate in plan view of the array substrate at least partially overlaps with that of the active layer. Optionally, each of the plurality of linear polarization blocks has a first transmission axis; and the lower polarizer on the array substrate has a third transmission axis substantially perpendicular to the first transmission axis.

Figure 8:
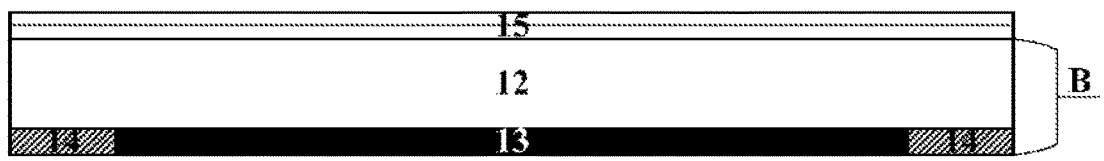
FIG. 8 is a schematic diagram illustrating the structure of a liquid crystal display apparatus in some embodiments according to the present disclosure.
Figure 8:
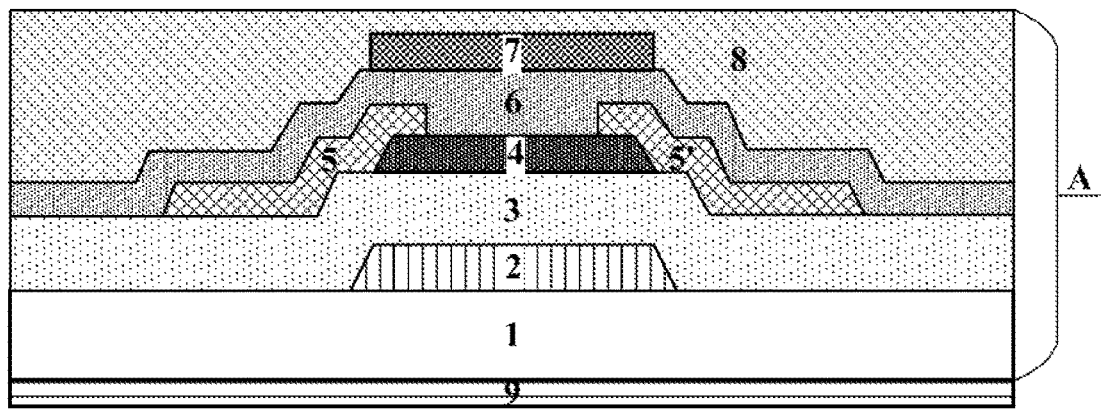

FIG. 8 is a schematic diagram illustrating the structure of a liquid crystal display apparatus in some embodiments according to the present disclosure. Referring to FIG. 8, the liquid crystal display apparatus in some embodiments includes an array substrate A and a counter substrate B facing the array substrate A. The liquid crystal display apparatus further includes a lower polarizer 9 disposed on the array substrate A and an upper polarizer 15 disposed on the counter substrate B. As shown in FIG. 8, the array substrate A in some embodiments includes a base substrate 1; a plurality of thin film transistor on the base substrate 1, each of the plurality of thin film transistor includes an active layer 4; and a first linear polarization layer having a plurality of first linear polarization blocks 2, each of the plurality of first linear polarization blocks 2 configured to shield at least a portion of the active layer 4 from light, e.g., an external light from a back light, which is disposed on a side of the lower polarizer 9 distal to the base substrate 1. Optionally, the plurality of first linear polarization blocks 2 is limited in an inter-subpixel region of the array substrate A. Optionally, the one of the plurality of first linear polarization blocks 2 substantially covers a channel region of the active layer 4 in plan view of the array substrate A. For example, a projection of the channel region of the active layer 4 on the base substrate 1 substantially overlaps with, and is within, that of the one of the plurality of first linear polarization blocks 2. Optionally, the one of the plurality of first linear polarization blocks 2 substantially covers the active layer 4 in plan view of the array substrate A. For example, a projection of the active layer 4 on the base substrate 1 substantially overlaps with, and is within, that of the one of the plurality of first linear polarization blocks 2. Optionally, the projection of the active layer 4 on the base substrate 1 substantially overlaps with, and is substantially co-extensive with, that of the one of the plurality of first linear polarization blocks 2.

Referring to FIG. 8, in some embodiments, each of the plurality of thin film transistors further includes a gate electrode 7 on a side of the active layer 4 distal to the one of the plurality of first linear polarization blocks 2. Optionally, the thin film transistor is a top gate-type thin film transistor. Optionally, the projection of the one of the plurality of first linear polarization blocks 2 on the base substrate 1 in plan view of the array substrate A substantially overlaps with that of the gate electrode 7. Optionally, the projection of the one of the plurality of first linear polarization blocks 2 on the base substrate 1 in plan view of the array substrate A substantially overlaps with, and is substantially co-extensive with, that of the gate electrode 7.

Referring to FIG. 8, the array substrate A in some embodiment further includes a buffer layer 3 between the first linear polarization layer and the active layer 4. Optionally, the array substrate A further includes a source electrode 5 and a drain electrode 5' on a side of the buffer layer 3 and the active layer 4 distal to the base substrate 1, a gate insulating layer 6 on a side of the source electrode 5, the drain electrode 5', and the active layer 6 distal to the base substrate 1, a gate electrode 7 on a side of the gate insulating layer 6 distal to the base substrate 1, and a passivation layer on a side of the gate electrode 7 distal to the base substrate 1.

Referring to FIG. 8, the liquid crystal display apparatus further includes a counter substrate B. In some embodiments, the counter substrate B is a color filter substrate, and includes a color filter layer 14 and a black matrix layer 13 on a second base substrate 12. The black matrix layer 13 is disposed in an inter-subpixel region of the display apparatus. The color filter layer 14 is disposed in a subpixel region of the display apparatus. As shown in FIG. 8, the liquid crystal display apparatus further includes an upper polarizer 15 on the counter substrate B, e.g., on a side of the second base substrate 12 distal to the color filter layer 14 and the black matrix layer 13.

In some embodiments, each of the plurality of linear polarization blocks 2 has a first transmission axis, the lower polarizer 9 on the array substrate 1 has a third transmission axis, and the upper polarizer 15 on the counter substrate B has a fourth transmission axis. Optionally, the first transmission axis is substantially perpendicular to the third transmission axis. Optionally, the first transmission axis is substantially parallel to the fourth transmission axis.

In some embodiments, the liquid crystal display apparatus further includes a second linear polarization layer having a plurality of second linear polarization blocks respectively corresponding to the plurality of first linear polarization blocks 2. Optionally, a projection of the one of the plurality of second linear polarization blocks on the base substrate 1 in plan view of the array substrate A at least partially overlaps with that of the active layer 4. Optionally, the plurality of second linear polarization blocks is limited in an inter-subpixel region of the array substrate A. Optionally, each of the plurality of second linear polarization blocks substantially covers a channel region of an active layer 4 in plan view of the array substrate A. For example, a projection of the channel region of the active layer 4 on the base substrate 1 substantially overlaps with, and is within, that of one of the plurality of second line polarization blocks. Optionally, each of the plurality of second linear polarization blocks substantially covers the active layer 4 in plan view of the array substrate A. For example, a projection of the active layer 4 on the base substrate 1 substantially overlaps with, and is within, that of the one of the plurality of second linear polarization blocks. Optionally, the projection of the active layer 4 on the base substrate 1 substantially overlaps with, and is substantially co-extensive with, that of the one of the plurality of second linear polarization blocks. Optionally, a projection of the one of the plurality of second linear polarization blocks 2' on the base substrate 1 in plan view of the array substrate substantially overlaps with that of a corresponding one of the plurality of first linear polarization blocks 2.

Optionally, each of the plurality of first linear polarization blocks has a first transmission axis; and each of the plurality of second linear polarization blocks has a second transmission axis substantially perpendicular to the first transmission axis. Optionally, each of the plurality of linear polarization blocks 2 has a first transmission axis, each of the plurality of second linear polarization blocks has a second transmission axis, the lower polarizer 9 on the array substrate 1 has a third transmission axis, and the upper polarizer 15 on the counter substrate B has a fourth transmission axis. Optionally, the first transmission axis is substantially perpendicular to the second transmission axis and the third transmission axis. Optionally, the first transmission axis is substantially parallel to the fourth transmission axis, and the second transmission axis is substantially parallel to the third transmission axis.

Optionally, the first linear polarization layer and the second linear polarization layer abut each other, e.g., as a laminated two-layer structure. Optionally, the array substrate A includes one or more layers between the first linear polarization layer and the second linear polarization layer. The one or more layer between the first linear polarization layer and the second linear polarization layer, however, is not a linear polarization layer having a transmission axis not substantially perpendicular to one of the first transmission axis and the second transmission axis. In one example, the array substrate A includes more than two linear polarization layers, the first linear polarization layer and the second linear polarization layer are adjacent linear polarization layers among all linear polarization layers, and the first transmission axis being substantially perpendicular to the second transmission axis.

Figure 9:
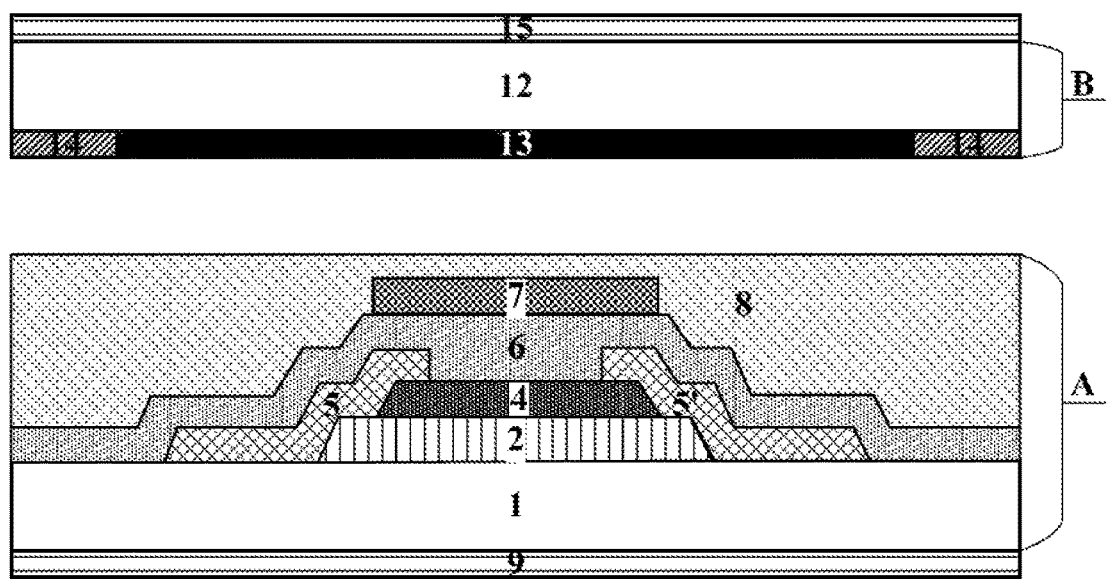
FIG. 9 is a schematic diagram illustrating the structure of a liquid crystal display apparatus in some embodiments according to the present disclosure.

FIG. 9 is a schematic diagram illustrating the structure of a liquid crystal display apparatus in some embodiments according to the present disclosure. The liquid crystal display apparatus in FIG. 9 differs from the liquid crystal display apparatus in FIG. 8 in that the array substrate A of the liquid crystal display apparatus in FIG. 9 does not include a buffer layer between the first linear polarization layer and the active layer 4. The first linear polarization layer in the array substrate A of the liquid crystal display apparatus in FIG. 9 is directly disposed on the base substrate 1, and the active layer 4 is disposed on a side of one of the plurality of first linear polarization blocks 2 distal to the base substrate 1.

In another aspect, the present disclosure further provides a thin film transistor. In some embodiments, the thin film transistor includes a base substrate; an active layer; and a first linear polarization block configured to shield at least a portion of the active layer from light, e.g., an external light from a back light, or light emitted from a light emitting layer of an array substrate having the thin film transistor. A projection of one of the first linear polarization block on the base substrate at least partially overlaps with that of the active layer. Optionally, the first linear polarization block is limited in an inter-subpixel region of an array substrate having the thin film transistor. Optionally, the first linear polarization block substantially covers a channel region of the active layer in plan view of the base substrate. For example, a projection of the channel region of the active layer on the base substrate substantially overlaps with, and is within, that of the first linear polarization block. Optionally, the first linear polarization blocks substantially covers the active layer in plan view of the base substrate. For example, a projection of the active layer on the base substrate substantially overlaps with, and is within, that of the first linear polarization block. Optionally, the projection of the active layer on the base substrate substantially overlaps with, and is substantially co-extensive with, that of the first linear polarization block.

In some embodiments, the thin film transistor further includes a gate electrode on a side of the active layer distal to the first linear polarization block. Optionally, the thin film transistor is a top gate-type thin film transistor. Optionally, the projection of the first linear polarization block on the base substrate in plan view of the base substrate substantially overlaps with that of the gate electrode. Optionally, the projection of the first linear polarization block on the base substrate in plan view of the base substrate substantially overlaps with, and is substantially co-extensive with, that of the gate electrode.

In some embodiments, the thin film transistor further includes a buffer layer between the first linear polarization block and the active layer. Optionally, the thin film transistor further includes a source electrode and a drain electrode on a side of the buffer layer and the active layer distal to the base substrate, a gate insulating layer on a side of the source electrode, the drain electrode, and the active layer distal to the base substrate, a gate electrode on a side of the gate insulating layer distal to the base substrate, and a passivation layer on a side of the gate electrode distal to the base substrate.

In some embodiments, the thin film transistor includes a base substrate, an active layer on the base substrate; and a first linear polarization block configured to shield at least a portion of the active layer from light. Optionally, the thin film transistor does not include a buffer layer between the first linear polarization block and the active layer. The first linear polarization block is directly disposed on the base substrate, and the active layer is disposed on a side of the first linear polarization block distal to the base substrate.

In some embodiments, the thin film transistor further includes a second linear polarization block corresponding to the first linear polarization block. Optionally, a projection of the second linear polarization block on the base substrate in plan view of the base substrate at least partially overlaps with that of the active layer. Optionally, projections of both the first linear polarization block and the second linear polarization block on the base substrate in plan view of the base substrate at least partially overlap with that of the active layer. Optionally, the first linear polarization block and the second linear polarization block abut each other, e.g., the first linear polarization block and the second linear polarization block are laminated together. Optionally, the first linear polarization block and the second linear polarization block are spaced apart by one or more layers. Optionally, the first linear polarization block has a first transmission axis, and the second linear polarization block has a second transmission axis substantially perpendicular to the first transmission axis. Optionally, the second linear polarization block is on a side of the first linear polarization block distal to the base substrate. Optionally, a projection of the second linear polarization block on the base substrate in plan view of the base substrate substantially overlaps with that of the first linear polarization block.

In some embodiments, the thin film transistor includes a base substrate; an active layer on the base substrate; a first linear polarization block; and a second linear polarization block; the first linear polarization block configured to shield at least a portion of the active layer from light when paired with the second linear polarization block. Optionally, the thin film transistor does not include a buffer layer between the second linear polarization block and the active layer. The first linear polarization block and the second linear polarization block in the thin film transistor are directly disposed on the base substrate, and the active layer is disposed on a side of the first linear polarization block and the second linear polarization block distal to the base substrate.

In some embodiments, the thin film transistor is a top gate-type thin film transistor. In some embodiments, the thin film transistor is a bottom gate-type thin film transistor. Optionally, the thin film transistor includes a base substrate, a gate electrode on the base substrate, a gate insulating layer on a side of the gate electrode distal to the base substrate, and an active layer on a side of the gate insulating layer distal to the base substrate. Optionally, the thin film transistor further includes a buffer layer on a side of the active layer distal to the base substrate, a first linear polarization block on a side of the buffer layer distal to the active layer, and a second linear polarization block on a side of the first linear polarization block distal to the base substrate. Optionally, the thin film transistor is a thin film transistor in an array substrate having a light emitting layer on a side of the second linear polarization block distal to the base substrate. Optionally, the thin film transistor is a thin film transistor in a bottom emission type light emitting diode apparatus or a dual emission type light emitting diode apparatus. Light emitted from the light emitting layer, or light reflected by a reflective top electrode towards the base substrate, is shielded by the first linear polarization block and the second linear polarization block from the active layer. The first linear polarization block has a first transmission axis, and the second linear polarization block has a second transmission axis substantially perpendicular to the first transmission axis, thereby substantially blocking light irradiated from the light emitting layer or the reflective top electrode.

For thin film transistors having both the first linear polarization block and the second linear polarization block, the first linear polarization block and the second linear polarization block may be disposed abutting each other, e.g., as a laminated two-layer structure. Optionally, the thin film transistor may include one or more layers between the first linear polarization block and the second linear polarization block. The one or more layer between the first linear polarization block and the second linear polarization block, however, is not a linear polarization layer having a transmission axis not substantially perpendicular to one of the first transmission axis and the second transmission axis. In one example, the thin film transistor may include more than two linear polarization blocks, the first linear polarization block and the second linear polarization block are adjacent linear polarization blocks among all linear polarization blocks, and the first transmission axis being substantially perpendicular to the second transmission axis.

In some embodiments, the thin film transistor is a bottom gate-type thin film transistor. Optionally, the thin film transistor includes a base substrate, a gate electrode on the base substrate, a gate insulating layer on a side of the gate electrode distal to the base substrate, and an active layer on a side of the gate insulating layer distal to the base substrate. Optionally, the thin film transistor includes further includes a first linear polarization block on a side of the active layer distal to the base substrate, and a second linear polarization block on a side of the first linear polarization block distal to the base substrate. In some embodiments, the thin film transistor is in an array substrate having a light emitting layer on a side of the second linear polarization block distal to the base substrate. Optionally, the thin film transistor does not include a buffer layer between the first linear polarization block and the active layer. Optionally, the first linear polarization block and the second linear polarization block are directly disposed on the active layer. Optionally, the first linear polarization block and the second linear polarization block are made of an insulating, non-metal material.

Various appropriate semiconductor materials and various appropriate fabricating methods may be used to make the linear polarization block, e.g., the first linear polarization block and the second linear polarization block. For example, a linear polarization material may be deposited on the substrate, e.g., by sputtering or vapor deposition or solution coating; and patterned. In some embodiments, the linear polarization material is a non-metal linear polarization material. Examples of linear polarization materials include, but are not limited to, magnesium fluoride ($MgF_2$), zinc oxide (ZnO), titanium oxide ($TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$), iridium oxide ($IrO_x$), aluminum oxide ($Al_2O_3$), silicon oxide ($SiO_2$), silicon on glass, and silicon nitride ($Si_3N_4$). Optionally, the linear polarization block is made of a nano-linear polarization material. Examples of nano-linear polarization materials include, but are not limited to, nano-magnesium fluoride ($MgF_2$), nano-zinc oxide (ZnO), nano-titanium oxide ($TiO_2$), nano-indium tin oxide (ITO), nano-indium zinc oxide (IZO), nano-aluminum zinc oxide (AZO), nano-magnesium zinc oxide (MZO), nano-gallium zinc oxide (GZO), nano-ruthenium oxide ($RuO_x$), nano-iridium oxide ($IrO_x$), nano-aluminum oxide ($Al_2O_3$), nano-silicon oxide ($SiO_2$), nano-silicon on glass, and nano-silicon nitride ($Si_3N_4$). Optionally, the linear polarization block is made of a nano-zinc oxide material. Optionally, the linear polarization block is made of a nano-titanium oxide material. Optionally, the linear polarization block is made of a nano-magnesium fluoride material.

In some embodiments, the linear polarization block is made of a plurality of nano particles such as nan-rods, nano-fibers, and nano-platelets. In some embodiments, the linear polarization block is formed by forming a nano-particles layer having a plurality of nano-particles on the base substrate, and aligning the plurality of nano-particles along a substantially the same direction. Optionally, transmission axes of the plurality of nano-particles are aligned along a substantially the same direction. For example, when the plurality of nano-particles are a plurality of nano-rods, longitudinal axes of the plurality of nano-rods are aligned along a substantially the same direction, thereby aligning the transmission axes of the plurality of nano-rods along a substantially the same direction. Optionally, the transmission axes are substantially parallel to the longitudinal axes. Optionally, the transmission axes are along a direction different from that of the longitudinal axes. Optionally, the step of aligning the plurality of nano-particles is performed by an electrically induced alignment process. Optionally, the step of aligning the plurality of nano-particles is performed by an electrospinning process. Optionally, the step of aligning the plurality of nano-particles is performed by a photoalignment process.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all tennis are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:
1. A thin film transistor, comprising:
a base substrate;
an active layer;
a first linear polarization block configured to shield at least a portion of the active layer from light; and
a second linear polarization block corresponding to the first linear polarization block;
wherein a projection of the first linear polarization block on the base substrate at least partially overlaps with that of the active layer;
a projection of the second linear polarization block on the base substrate at least partially overlaps with that of the active layer;
the first linear polarization block has a first transmission axis;
the second linear polarization block has a second transmission axis substantially perpendicular to the first transmission axis;
the active layer is on a side of one of the first linear polarization block and the second linear polarization block closer to the base substrate; and the first linear polarization block and the second linear polarization block are configured to shield at least a portion of the active layer from light emitted from a light emitting layer.

2. The thin film transistor of claim 1, wherein the first linear polarization block is made of a nano-linear polarization material.

3. The thin film transistor of claim 2, wherein the nano-linear polarization material comprises a compound selected from the group consisting of magnesium fluoride ($MgF_2$), zinc oxide (ZnO), titanium oxide ($TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$), iridium oxide ($IrO_x$), aluminum oxide ($Al_2O_3$), silicon oxide ($SiO_2$), silicon on glass, and silicon nitride ($Si_3N_4$).

4. The thin film transistor of claim 1, further comprising a gate electrode on a side of the active layer away from the first linear polarization block;
wherein the projection of the first linear polarization block on the base substrate substantially overlaps with that of the gate electrode.

5. The thin film transistor of claim 1, further comprising a buffer layer between the first linear polarization block and the active layer.

6. The thin film transistor of claim 1, wherein the first linear polarization block is made of a non-metal material.

7. An array substrate, comprising:
a base substrate;
a plurality of thin film transistors on the base substrate, a respective one of which comprising an active layer;
a first linear polarization layer comprising a plurality of first linear polarization blocks, a respective one of which configured to shield at least a portion of the active layer from light; and
a second linear polarization layer comprising a plurality of second linear polarization blocks respectively corresponding to the plurality of first linear polarization blocks;
wherein a projection of one of the plurality of first linear polarization blocks on the base substrate at least partially overlaps with that of the active layer;
a projection of the one of the plurality of second linear polarization blocks on the base substrate at least partially overlaps with that of the active layer;
a respective one of the plurality of first linear polarization blocks has a first transmission axis;
a respective one of the plurality of second linear polarization blocks has a second transmission axis substantially perpendicular to the first transmission axis;
the active layer is on a side of one of the plurality of first linear polarization blocks and one of the plurality of second linear polarization blocks closer to the base substrate; and
the one of the plurality of first linear polarization blocks and the one of the plurality of second linear polarization blocks are configured to shield at least a portion of the active layer from light emitted from a light emitting layer.

8. The array substrate of claim 7, wherein the first linear polarization layer is made of a nano-linear polarization material.

9. The array substrate of claim 8, wherein the first linear polarization block is made of a non-metal material.

10. The array substrate of claim 8, wherein the nano-linear polarization material comprises a compound selected from the group consisting of magnesium fluoride ($MgF_2$), zinc oxide (ZnO), titanium oxide ($TiO_2$), indium tin oxide (ITO), indium zinc oxide (IZO), aluminum zinc oxide (AZO), magnesium zinc oxide (MZO), gallium zinc oxide (GZO), ruthenium oxide ($RuO_x$), iridium oxide ($IrO_x$), aluminum oxide ($Al_2O_3$), silicon oxide ($SiO_2$), silicon on glass, and silicon nitride ($Si_3N_4$).

11. The array substrate of claim 7, wherein each of the plurality of thin film transistors further comprises a gate electrode on a side of the active layer away from the one of the plurality of first linear polarization blocks; and
the projection of the one of the plurality of first linear polarization blocks on the base substrate substantially overlaps with that of the gate electrode.

12. The array substrate of claim 7, further comprising a buffer layer between the first linear polarization layer and the active layer.

13. A display panel, comprising the array substrate of claim 7.

\* \* \* \* \*